United States Patent
Chun et al.

(10) Patent No.: US 7,580,281 B2
(45) Date of Patent: Aug. 25, 2009

(54) FLASH MEMORY DEVICE WITH WRITE PROTECTION

(75) Inventors: Jin-Young Chun, Gangnam-gu (KR); Jae-Yong Jeong, Yongin-si (KR); Chi-Weon Yoon, Seocho-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 40 days.

(21) Appl. No.: 11/969,969

(22) Filed: Jan. 7, 2008

(65) Prior Publication Data
US 2008/0170436 A1   Jul. 17, 2008

(30) Foreign Application Priority Data
Jan. 17, 2007   (KR) ...................... 10-2007-0005259

(51) Int. Cl.
G11C 11/34 (2006.01)
(52) U.S. Cl. ............................. 365/185.04; 365/185.33
(58) Field of Classification Search ............ 365/185.04, 365/185.11, 185.33
See application file for complete search history.

(56) References Cited

U.S. PATENT DOCUMENTS

| 5,668,760 | A | * | 9/1997 | Hazen | .................. | 365/189.14 |
|---|---|---|---|---|---|---|
| 6,031,757 | A | | 2/2000 | Chuang et al. | | |
| 6,125,055 | A | | 9/2000 | Kasa et al. | | |
| 6,229,731 | B1 | * | 5/2001 | Kasai et al. | ............ | 365/185.04 |
| 6,556,476 | B1 | * | 4/2003 | Na | ........................ | 365/185.04 |
| 6,731,536 | B1 | | 5/2004 | McClain et al. | | |
| 6,970,381 | B2 | | 11/2005 | Nakata | | |
| 2005/0237800 | A1 | | 10/2005 | Kurosaki | | |

FOREIGN PATENT DOCUMENTS

| JP | 08044628 | 2/1996 |
|---|---|---|
| JP | 11213680 | 8/1999 |
| KR | 1020000060880 A | 10/2000 |
| KR | 1020060086364 A | 7/2006 |
| WO | 2005101423 A1 | 10/2005 |

* cited by examiner

Primary Examiner—Anh Phung
(74) Attorney, Agent, or Firm—Volentine & Whitt, PLLC

(57) ABSTRACT

A flash memory device and a related method of write protecting data are disclosed. The flash memory device includes a protection controller having a latch circuit storing temporary protected/accessible data, a cell array storing persistent protected/accessible data, a write controller altering the persistent protected/accessible data, and a latch controller altering the temporary protected/accessible data.

14 Claims, 3 Drawing Sheets

FLASH MEMORY DEVICE WITH WRITE PROTECTION

CROSS REFERENCE TO RELATED APPLICATIONS

This application claims priority to Korean Patent Application No. 2007-005259 filed on Jan. 17, 2007, the subject matter of which is hereby incorporated by reference.

BACKGROUND OF THE INVENTION

1. Field of the Invention

The present invention related generally to non-volatile memory devices. More particular, the invention relates to a flash memory device capable of designating memory blocks in a lock state or a write-protection state.

2. Description of the Related Art

Flash memory is a common type of electronically erasable and programmable read only memory (EEPROM). Conventional flash memory is characterized by the use of a single transistor memory cell which enables high integration density of the constituent memory cells, excellent operating reliability, and relatively low power consumption. Due to these properties, flash memory has been increasingly used in low-power applications like those associated with portable electronic devices, such as personal digital assistant devices, digital cameras, cellular phones, MP3 players, etc.

Due to relatively easy software upgrading capabilities and good data storage capacity, both system program code (e.g., operating system code and/or application code) and system data (e.g., data files, music and pictures files, etc.) are often stored in flash memory. Where flash memory is used to store upgradeable (or patch-able) program code and/or critical system data, certain precautions must be taken to protect critical code and data from being inadvertently over-written (i.e., reprogrammed) or erased.

Older EEPROMs required a global erase and re-write to update stored code or data. Contemporary flash memory allows stored code or data to be block-erased, where the storage capacity provided by the flash memory is divided into blocks similar to disk sectors in a disk operating system. When a block-based architecture is used, instead of erasing the memory, selected one or more blocks of memory may be erased using a conventional file manager and/or a conventional memory manager. Using a block-based architecture, a number of memory blocks may be designated as erasable without restriction, while others may be erased (or over-write protected). For example, critical system code such as a system boot file may be stored in a protected memory block in a flash memory device. Other memory blocks may be allocated for the storage of other types of system code or data.

In order to ensure the integrity of a block-based flash memory device, there must be some sort of memory block protection scheme enabled during program and erase operations. That is, protected memory blocks in a flash memory must be safeguarded during operations having the potential to destroy critical system code or data. This is true regardless of which particular memory block is being accessed by the operation (i.e., a protected memory block or an accessible memory block). In certain applications, the preservation of critical system code and data in a protected memory block must also be addressed in counter-measures related to virus protection or software malfunctions.

One example of a system and method protecting stored data from being unintentionally over-written is disclosed, for example, in U.S. Pat. No. 6,209,069, the subject matter of which is hereby incorporated by reference.

FIG. 1 summarizes in relevant portion of this conventional system. Referring to FIG. 1, a block control circuit 206 includes a plurality of latches 301 through 30N corresponding one-for-one with a plurality of designated memory blocks BLOCK 1 through BLOCK N. Each latch 301 through 30N may be programmed with data indicating a lock state or a write state for the corresponding memory block BLOCK 1 through BLOCK N. Based on the data contents of the plurality of latches, respective block latch control signals are applied in relation to memory blocks in the flash memory array.

In the illustrated example of FIG. 1, the data contents of each latch 301 through 30N is determined in relation to a system reset signal, a group latch control signal, and respective block latch control signals, applied to reset (R), clocking, and data (D) inputs of the respective latches.

Where this type of conventional memory block protection scheme is used, upon host device power-up, the plurality of latches in block control circuit 206 is set/reset to indicate either the lock/write state for each memory block. Subsequent to this initialization process, user definitions or host device operations may alter the lock/write state of a memory block, and therefore the data contents of one or more of the plurality of latches. In this manner, the plurality of latches may be used as a scratch pad memory track or temporarily store the current lock/write state of the respective memory blocks. Unfortunately, such storage is volatile in nature and may be lost during an unexpected power down or functional interruption of the block control circuit. Additionally, data glitches may result in erroneous register entries (i.e., set/reset values being stored) upon power-up initialization.

SUMMARY OF THE INVENTION

Embodiments of the invention provide a flash memory device capable of easily managing the lock/write state of constituent memory blocks. Embodiments of the invention allow such lock/write state information to be stored in a nonvolatile manner. Yet, embodiments of the invention allow easy update of this lock/write state information.

In one embodiment, the invention provides a flash memory device comprising; a memory cell array comprising a plurality of memory blocks, control logic configured to control execution of a write operation directed to an identified memory block in the plurality of memory block, and a protection controller configured to generate a protection flag signal associated with the identified memory block, wherein execution of the write operation by the control logic is enabled or disabled by the protection flag signal, wherein the protection controller comprises; a latch circuit comprising a plurality of latches, each corresponding to one of the plurality of memory blocks and storing temporary protected/accessible data, a cell array comprising a plurality of non-volatile memory cells storing, each corresponding to one of the plurality of memory blocks and storing persistent protected/accessible data, an address decoder receiving an address, a write controller responsive to a received command and configured to alter the persistent protected/accessible data in relation to the address, and a latch controller responsive to a received command and configured to alter the temporary protected/accessible data in relation to the address.

In another embodiment, the invention provides a method of write protecting data stored in an identified memory block of a memory cell array, the method comprising; enabling or disabling a write operation in control logic associated with the memory cell array in relation to a protection flag signal, and generating the protection flag signal by comparing temporary protected/accessible data stored in a latch circuit comprising a plurality of latches with persistent protected/accessible data stored in a cell array comprising a plurality of non-volatile memory cells.

DESCRIPTION OF EMBODIMENTS

Preferred embodiments of the invention will be described hereafter with reference to the accompanying drawings.

Figure 1:
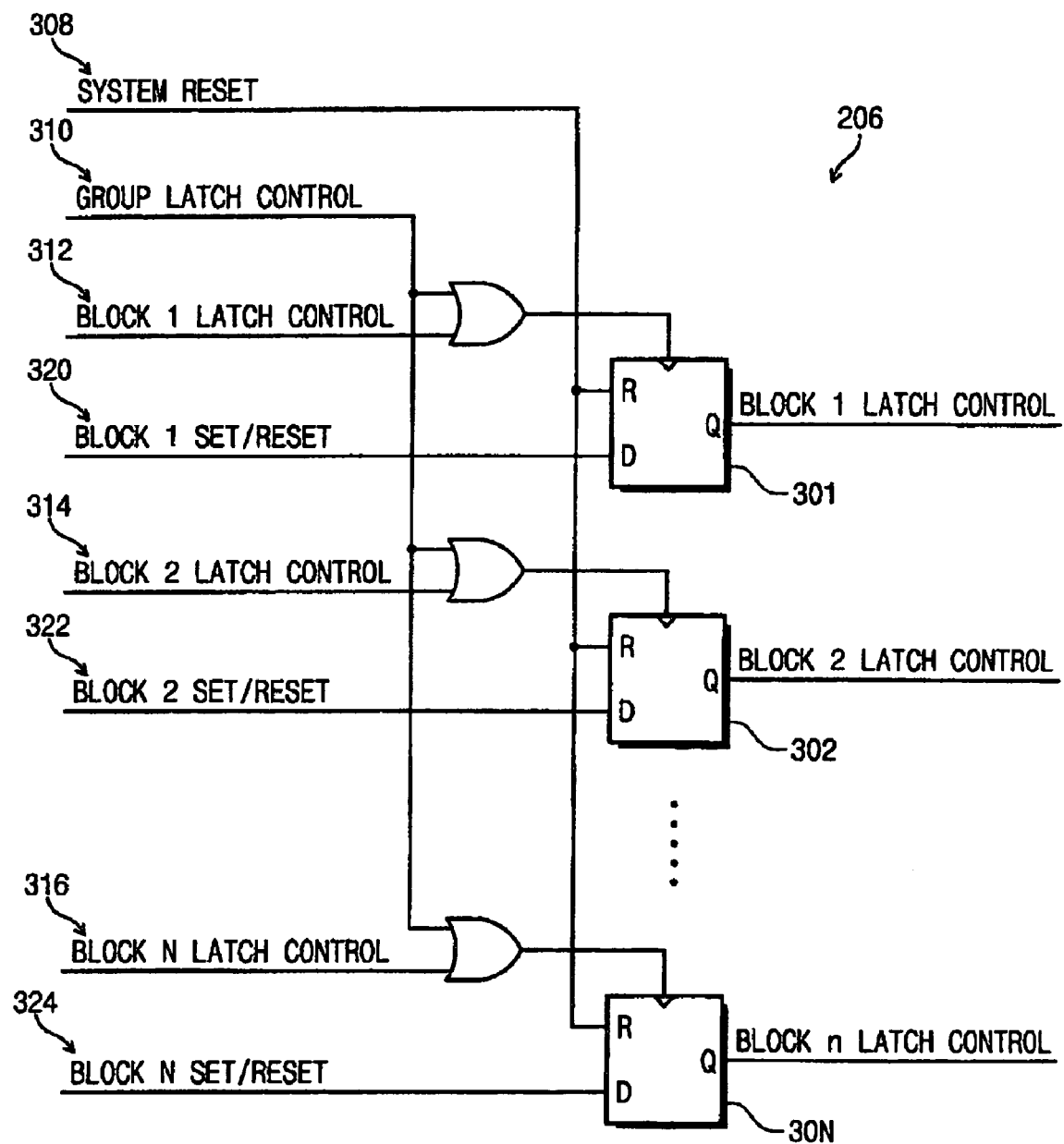
FIG. 1 is a circuit diagram illustrating a block control circuit for a conventional flash memory device.
Figure 2:
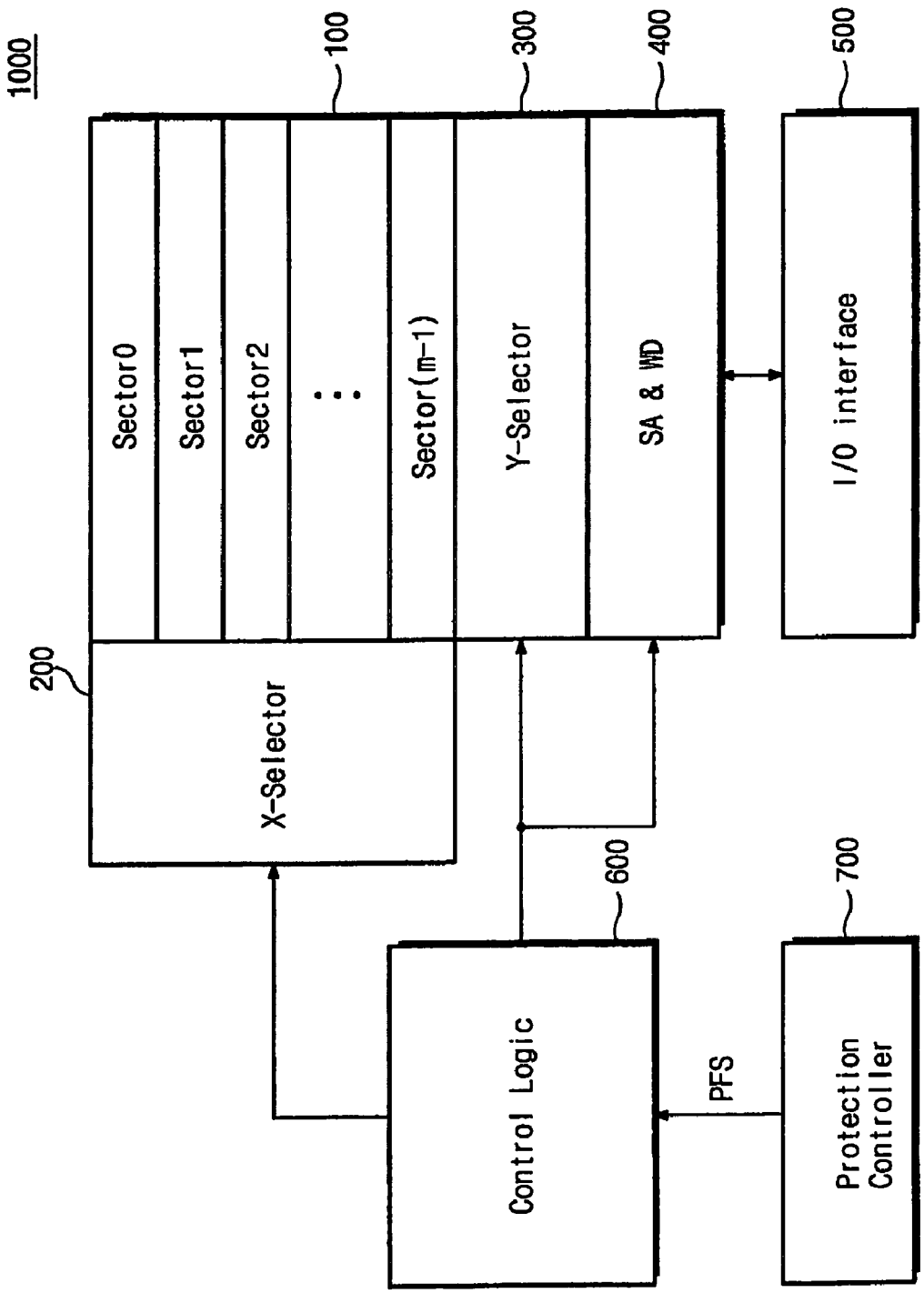
FIG. 2 is a block diagram illustrating a flash memory device according to an embodiment of the invention.

FIG. 2 is a block diagram illustrating a flash memory device according to an embodiment of the invention. Referring to FIG. 2, a flash memory device 1000 comprises a memory cell array 100 adapted to store data in a plurality of memory blocks. The stored data may be related to system code and/or system data. Each memory block comprises an array of memory cells arranged in a matrix defined by word lines arranged in rows and bit lines arranged in columns. In certain embodiments of the invention memory cell in the array may be a NAND or NOR flash memory cell adapted to store N-bit data, wherein N is a positive integer.

A row selector circuit 200 associated with memory cell array 100 may be controlled by control logic 600 and configured to select row-wise memory blocks within memory cell array 100 in response to a received row address. A column selector circuit 300 associated with memory cell array 100 may also be controlled by control logic 600 and configured to select columns within memory cell array 100 in response to a received column address.

A sense amplifier and write driver circuit 400 associated with memory cell array 100 and column selector 300 may also be controlled by control logic 600 and configured to sense read data retrieved from memory cell array 100 during a read operation or drive write data onto the bits lines during a program operation. During a program operation, sense amplifier and write driver circuit 400 may be configured to program data input received via an input/output interface 500.

Control logic 600 may be configured to control an overall operation of flash memory device 1000. In particular, when a program operation is indicated by (e.g.) a received system command, control logic 600 may selectively perform the indicated program operation in relation to a protection flag signal (PFS) provided by a protection controller 700.

In one embodiment of the invention, the protection flag signal PFS may be used to indicate a protected (or locked) state verses an accessible (or erase/program enabled) state. Each erase or program operation indicated to the flash memory device 100 is conditionally performed in relation to a corresponding memory block only in accordance with an affirmative indication by the protection flag signal PFS.

Protection controller 700 may be configured to store protected/accessible state information from which the protection flag signal is derived using volatile and/or nonvolatile data storage components. When an erase or program operation is indicated in relation to a particular memory block, protection controller 700 may determine whether the particular memory block is currently in a protected state or an accessible state. Protection controller 700 may then output a protection flag signal PFS indicating this determination result.

Figure 3:
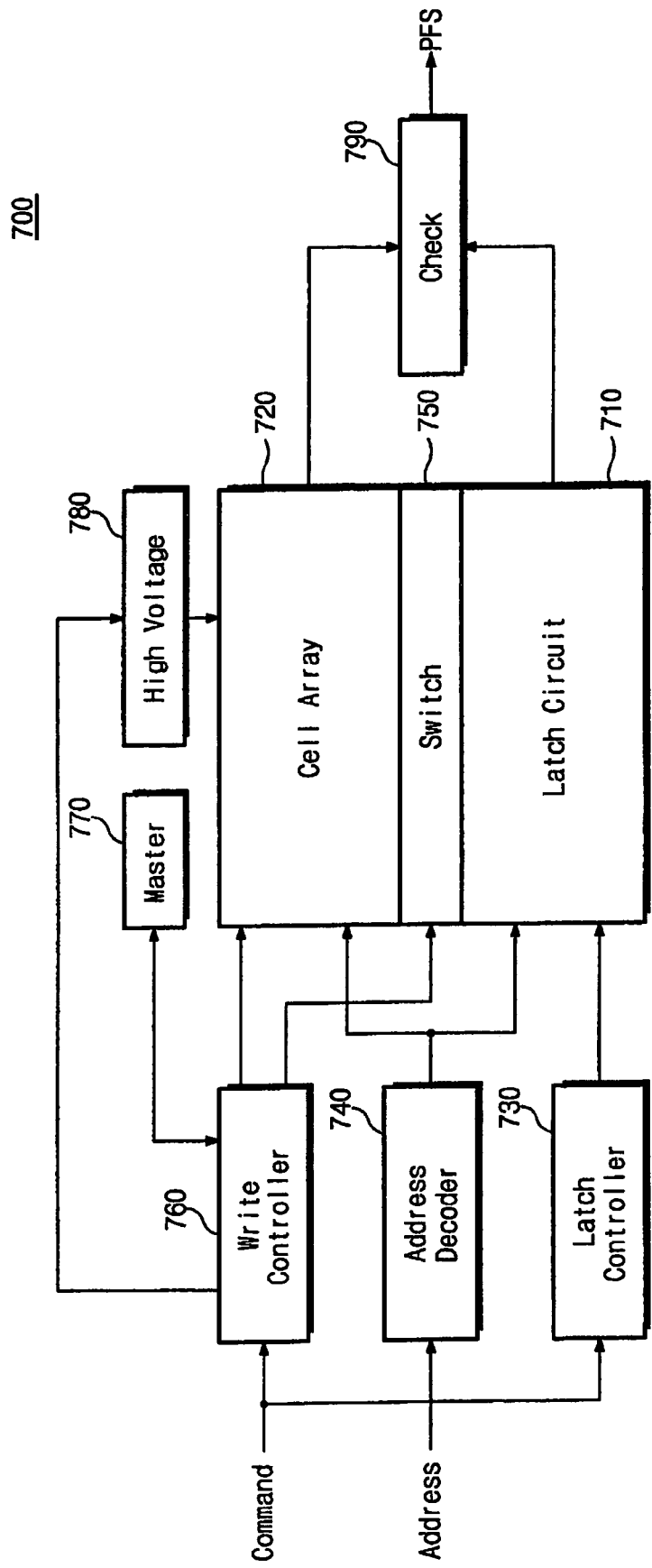
FIG. 3 is a block diagram further illustrating the protection controller of FIG. 2 according to an embodiment of the invention.

FIG. 3 is a block diagram further illustrating protection controller 700 of FIG. 2 according to an embodiment of the invention. Referring to FIG. 3, protection controller 700 comprises a latch circuit 710, a cell array 720, a latch controller 730, an address decoder 740, an (optional) switch circuit 750, a write controller 760, a master cell 770, a high voltage generator 780, and a check circuit 790.

Latch circuit 710 may be configured to temporarily store data indicating the protected/accessible state of each memory block in memory cell array 100 of FIG. 2. The plurality of latches forming latch circuit 710 may be set/reset upon power-up to indicate a protected/accessible state. In one embodiment of the invention, the entire plurality of latches in latch circuit 710 may be set to indicate a protected state upon power-up. However, respective protected/accessible state data for individual latches in the plurality of latches may be dynamically altered by latch controller 730, as will be described hereafter. Cell array 720 is implemented using an arrangement of non-volatile memory cells that correspond to memory blocks in memory cell array 100, or that correspond to the plurality of latches in latch circuit 710. The non-volatile memory cells of cell array 720 may be erased or programmed under the control of write controller 750. Each of the non-volatile memory cells in cell array 720 is able to store data indicating protected/accessible state information, as provided by latch circuit 710, in a non-volatile manner so it is not lost upon power-down.

Latch controller 730 operates in response to an externally provided command to alter the data stored in latch circuit 710.

Address decoder 740 receives an externally provided address and operates in conjunction with latch controller 730 and write controller 760 to alter the data stored in latch circuit 710 and cell array 720. In one embodiment of the invention the address may be a memory block address or a portion of a larger address applied to memory cell array 100 indicating a particular memory block.

Switch circuit 750 connects the plurality of latches in latch circuit 710 with the non-volatile memory cells in cell array 720 and operates under the control of protect controller 760.

Protection controller 760 may be configured to control the data contents stored in cell array 720 and latch circuit 710 in relation to received commands. For example, a received command may alter the protected/accessible state of an identified memory block in memory cell array 100 temporarily. Accordingly, protection controller 760 in conjunction with address controller 740 and latch controller 730 will change a corresponding data entry for one of the plurality of latches in latch circuit 710 corresponding to the identified memory block. The change in the data entry for the latch amounts to a temporary change in the protected/accessible state of the corresponding memory block.

Alternately, a different received command may alter the protected/accessible state of an identified memory block in memory cell array 100 persistently. According, protection controller 760 in conjunction with address controller 740 will change a corresponding data entry for one of non-volatile memory cells in cell array 720 corresponding to the identified memory block. The change in the data entry for the non-volatile memory cell amounts to persistent change in the protected/accessible state of the corresponding memory block.

In one embodiment of the invention, rather than directly alter the data contents of cell array 720, the write controller may perform a data dump operation from latch circuit 710 to cell array 720. The data dump operation may thus take one or more temporary protected/accessible state changes reflected by the current contents of latch circuit 710 and make such changes persistent in cell array 720. Using conventionally understood data transfer operations and functionality, switch circuit 750 may be used to dump data from latch circuit 710 to cell array 720 under the control of write controller 760.

In the context of the foregoing write operations directly applied to latch circuit 710 and/or cell array 720 by write controller 760, or in the context of the data dump operation, master cell 770 may be referenced to safeguard existing data entries in at least cell array 720. That is, before write controller 760 may change a data entry in one or more of the non-volatile memory cells of cell array 720, the reference data stored in master cell 770 must be consulted.

In one view, master cell 770 ensures the protection of critical data stored at least in cell array 720 in a manner analogous to protection controller 700 ensuring the protection of critical data stored in memory cell array 100. In one embodiment, master cell 770 may be implemented using One Time Programmable (OTP) memory cells. Thus, it will be impossible to alter the contents of master cell 770 once programmed. In other embodiments, the non-volatile memory cell data contents of master cell 770 may be changed by certain commands received by write controller 760.

Use of master cell 770 allows a global data dump operation to between latch circuit 710 and cell array 720 without fear of inadvertently altering persistent critical protected/accessible state data stored in cell array 720.

High voltage generator 780 may be used to provide conventionally understood high voltage signals to cell array 720 (and possibly master cell 770) under the control of write controller 760.

In some embodiments of the invention, check circuit 790 may be used to check whether corresponding data entries to cell array 720 and latch circuit 710 for an identified memory block are the same. In certain embodiments of the invention, if at least one of these data entries indicates a protected state for the memory block, check circuit 790 will output a negative protection flag signal PFS indicating a protected state for the memory block. Thus, even a normally accessible memory block may be temporarily protected without altering its persistent protected/accessible status in cell array 720 by means of check circuit 790. This condition may arise as a function of a particular instruction or subroutine being executed in the system incorporating flash memory device 1000 which places a temporary or conditional block on accessing the contents of the identified memory block.

In other embodiments, check circuit 790 may generate an error signal or invoke an error handling routine if data entries in cell array 720 and latch circuit 710 do not match. Under such circumstances, the data entries must agree and both indicate an accessible state for the identified memory block before protection controller through check circuit 790 provides a positive protection flag signal PFS.

Hereinafter, an exemplary operation of protection controller 700 according to an embodiment of the invention will be described in some additional detail with reference to accompanying drawings.

The plurality of latches in latch circuit 710 may be reset to a protect state upon power-up. Since the plurality of latches in latch circuit 710 are all set to indicate a protected state, the protection flag signal PFS provided by protection controller 700 will indicate a protected state for all memory blocks in memory array 100. This condition precludes all write operations to memory cell array 100, as enforced by control logic 600.

In order to enable a write operation with respect to an identified memory block, it must first be reset to an accessible state. This may be accomplished by a command received by write controller 760 that alters the data contents of a latch in latch circuit 710 corresponding to the identified memory block. This change in latch data is made using latch controller 730 and address decoder 740.

That is, the address of the identified memory block is provided to address decoder 740, and the contents of the latch within latch circuit 710 indicated by the address is changed by latch controller 730. Afterwards, a write operation directed to this particular (now accessible) memory block in memory array 100 may be performed using conventionally understood techniques under the control of control logic 600. Other memory blocks may be made accessible in a similar manner.

Since the protected/accessible state information indicated by the data contents stored in the plurality of latches within latch circuit 710 will be lost when applied power is interrupted, at some point in the operation of the host device incorporating flash memory device 100, the contents of latch circuit 710 may be data dumped to cell array 720. This data dump may be done as a precautionary operation, upon power-off, or in response to a detected power failure. Alternately, individual non-volatile memory cells in cell array 720 may be programmed in response to commands received by write controller 760.

Data dump operations between the circuit 710 and cell array 720 may be facilitated by means of switch circuit 750, or a similar circuit enabling conventional data dumping techniques.

All data dump operations and separate write commands applied to the non-volatile memory cells of cell array 720 by write controller 760 are enabled or disabled with reference to the data contents of master cell 770.

Using a protection controller according to an embodiment of the invention, it is possible to effectively update or write to all or a portion of memory cell array 100 without fear of losing critical system code or data. Data blocks within memory cell array 100 may be safeguarded by the techniques described above in relation to the protection controller.

The invention has been described in the context of certain exemplary embodiments. However, it will be understood by those skilled in the art that the scope of the invention is not limited to only the illustrated embodiments. On the contrary, it is intended that the scope of the invention cover various modifications and extensions to the foregoing. The scope of the claims, therefore, should be accorded the broadest interpretation so as to encompass all such modifications and extensions.

What is claimed is:

1. A flash memory device comprising:
    a memory cell array comprising a plurality of memory blocks;
    control logic configured to control execution of a write operation directed to an identified memory block in the plurality of memory block; and
    a protection controller configured to generate a protection flag signal associated with the identified memory block, wherein execution of the write operation by the control logic is enabled or disabled by the protection flag signal, wherein the protection controller comprises:
        a latch circuit comprising a plurality of latches, each corresponding to one of the plurality of memory blocks and storing temporary protected/accessible data;

a cell array comprising a plurality of non-volatile memory cells storing, each corresponding to one of the plurality of memory blocks and storing persistent protected/accessible data;

an address decoder receiving an address;

a write controller responsive to a received command and configured to alter the persistent protected/accessible data in relation to the address; and a latch controller responsive to a received command and configured to alter the temporary protected/accessible data in relation to the address.

2. The flash memory device of claim 1, further comprising:
a master cell storing reference data related to the plurality of memory blocks, wherein the write controller conditionally alters the persistent protected/accessible data in relation to the reference data.

3. The flash memory device of claim 2, wherein the master cell comprises one time programmable (OTP) memory cells storing the reference data.

4. The flash memory device of claim 2, wherein the master cell comprises non-volatile memory cells storing the reference data, wherein the write controller is further configured to alter the reference data stored in the master cell.

5. The flash memory device of claim 1, further comprising:
a check circuit comparing temporary protected/accessible data and persistent protected/accessible data associated with the identified memory block and in response generating the protection flag signal.

6. The flash memory device of claim 1, further comprising:
a switch connecting the latch circuit and the cell array, such a data dump operation of temporary protected/accessible data from the latch circuit into the cell array to form the persistent protected/accessible data may be performed by the write controller.

7. The flash memory device of claim 1, further comprising:
a high voltage generator configured to provide high voltage signals required to alter the persistent protected/accessible data in the cell array.

8. The flash memory device of claim 4, further comprising:
a high voltage generator configured to provide high voltage signals required to alter the persistent protected/accessible data in the master cell.

9. A method of write protecting data stored in an identified memory block of a memory cell array, the method comprising:

enabling or disabling a write operation in control logic associated with the memory cell array in relation to a protection flag signal; and generating the protection flag signal by comparing temporary protected/accessible data stored in a latch circuit comprising a plurality of latches with persistent protected/accessible data stored in a cell array comprising a plurality of non-volatile memory cells.

10. The method of claim 9, further comprising:
altering the persistent protected/accessible data stored in the cell array in response to a received address and command.

11. The method of claim 10, wherein alteration of the persistent protected/accessible data stored in the cell array is conditionally made with reference to reference data stored in a master cell.

12. The method of claim 9, further comprising:
altering the temporary protected/accessible data stored in the latch circuit in response to a received address and command.

13. The method of claim 11, further comprising:
data dumping the altered temporary protected/accessible data stored in the latch circuit to the cell array to become persistent protected/accessible data stored in the cell array.

14. The method of claim 13, wherein data dumping of the temporary protected/accessible data stored to the cell array is conditionally made with reference to reference data stored in a master cell.

* * * * *